United States Patent [19]
Ruppi

[11] Patent Number: 5,700,569
[45] Date of Patent: Dec. 23, 1997

[54] MULTILAYERED ALUMINA COATED CEMENTED CARBIDE BODY

[75] Inventor: Sakari Ruppi, Fagersta, Sweden

[73] Assignee: Seco Tools AB, Fagersta, Sweden

[21] Appl. No.: 613,533

[22] Filed: Mar. 11, 1996

Related U.S. Application Data

[63] Continuation of Ser. No. 390,507, Feb. 17, 1995, abandoned.

[51] Int. Cl.$^6$ ................................................. B32B 9/04
[52] U.S. Cl. ................... 428/336; 428/457; 428/469; 428/698; 428/701; 428/702; 51/307; 51/309
[58] Field of Search ................. 51/307, 309; 428/336, 428/216, 457, 469, 698, 701, 702

[56] References Cited

U.S. PATENT DOCUMENTS

| | | | |
|---|---|---|---|
| Re. 31,520 | 2/1984 | Lindstrom et al. | 7/138 |
| Re. 32,110 | 4/1986 | Hale | 428/336 |
| 4,746,563 | 5/1988 | Wakano et al. | 428/216 |
| 4,984,940 | 1/1991 | Bryant et al. | 428/698 |
| 5,137,774 | 8/1992 | Ruppi | 428/216 |
| 5,162,147 | 11/1992 | Ruppi | 428/216 |

*Primary Examiner*—Archene Turner
*Attorney, Agent, or Firm*—Burns, Doane, Swecker & Mathis, L.L.P.

[57] ABSTRACT

There is disclosed an alumina coated cemented carbide insert having improved properties for metal cutting applications. The insert has 6 to 8 layers of alumina with a total coating thickness of up to about 15 μm. It has also been found that varying the number of layers can change the color of the coated insert.

10 Claims, 9 Drawing Sheets

FIG. 6  Cutting Performance, coating per insert, at different cutting speed

MULTILAYERED ALUMINA COATED CEMENTED CARBIDE BODY

This application is a continuation of application Ser. No. 08/390,507, filed Feb. 17, 1995 now abandoned.

BACKGROUND OF THE INVENTION

Aluminum oxide matings deposited on cemented carbides generally with either an intermediate coating of one or more of TiC, Ti(C,N), TiN compounds or a gamma-phase enriched substrate are well-known. Products made according to, for example, Hale (U.S. Reissue Pat. No. 32,110) and Lindstrom et al. (U.S. Reissue Pat. No. 31,520) describe such products which have enjoyed considerable commercial success in their use as inserts for metal cutting.

In my earlier U.S. Pat. Nos. 5,137,774 and 5,162,147, the disclosures of both of which are herein incorporated by reference, there are described particular coatings of κ phase alumina and/or α and κ phase alumina including multilayered coatings. While such products offer significant improvements over single layer α and/or κ alumina coated cemented carbide inserts, there is a further need for optimization of such products.

OBJECTS AND SUMMARY OF THE INVENTION

It is an object of this invention to avoid or alleviate the problems of the prior art.

It is further an object of this invention to provide a multilayered alumina coated cemented carbide insert having significant operating advantages.

In one aspect of the invention there is provided a coated sintered cemented carbide having a substrate containing at least one metal carbide and a binder metal and a coating having a plurality of layers on alumina, the improvement comprising having from 6–8 alumina layers, the total thickness of the alumina layers being up to about 15 μm.

In another aspect of the invention there is provided a method of changing the color of the exterior surface of a cemented carbide having an alumina coating of a thickness of up to about 15 μm comprising coating the said cemented carbide with a multiplicity of alumina coatings, each said coating having a thickness of up to 1.5 μm.

DETAILED DESCRIPTION OF THE PREFERRED EMBODIMENTS OF THE INVENTION

According to the preferred embodiment of the present invention, the article of the present invention is a sintered cemented carbide having a substrate containing at least one metal carbide and a binder metal and a coating having 6–8 alumina layers with the total thickness of the alumina layers being up to about 15 μm.

The substrate of the present invention is a hard metal or cemented carbide as known in the art which comprises a major part of the metal carbide, such as tungsten carbide, with minor additions, if desired of, for example, TiC, NbC, HfC, VC or the like, with an iron group metal binder, preferably cobalt. Often, and prior to the deposition of the alumina coating, the cemented carbide is first coated with a thin intermediate layer of a wear resistant carbide, nitride, carbonitride, carboxide, carboxynitride and/or boride of one or more of the elements Ti, Zr, Hf, V, Nb, Ta, Cr, Mo, W, Si and/or B having a thickness of from about 1–5 μm, preferably about 3 μm. TiC, TiN, and/or Ti(C,N) are preferred.

The alumina layers are thereafter applied as individual layers with each alumina layer being up to about 1.5 μm thick, preferably from about 0.5–1 μm thick. It is expected that having multilayers of the alumina as the coating will improve certain of the properties (e.g., crater war and flank wear) of the resulting mated insert when used in metal cutting and that these properties will improve as the number of such layers in any given coating thickness increases. However, it has unexpectedly been found that these properties increase as the number of coatings increase to a certain point and then decrease as the number of layers increase. (See, e.g., FIG. 6.) For optimum results, the alumina coating contains from 6–8 layers.

While the layers may be simply applied one on top of the other, it has been found that when κ-alumina is the desired form of the aluminum to be deposited, that the surface of the underlying alumina layer (whether α or κ) should contain a thin modification layer to insure the nucleation of κ-aluminum as the next coating. A modification layer is not necessary (and is generally deleterious to adhesion) between the thin intermediate layer (e.g., TiC, TiN, and/or Ti(C,N)) and the first κ-alumina layer. There is a bonding layer between the intermediate layer and the κ-alumina layer on the substrate after the heat treatment, e.g., the bonding layer can be any of the materials which would help adhere and the knowledge of which is in the purview of one of ordinary skilled in the art. The modification layer is a thin (0.05–0.5 μm, preferably about 0.05–0.1 μm) surface oxidized layer, for example, of $(Al_xTi_y)(O_wC_z)$ deposited via CVD where y and x are from 2–4 and z and w are from 0.6–0.8.

The modification layer may also contain nitrogen, e.g., $(Al_xTi_y)(O_wC_zN_n)$ where x and y are from 2–4 and w and z and u are from 0.6–0.8. In addition, the layer may have a homogenous chemistry or may preferably have a nitrogen gradient that varies throughout its thickness with the maximum nitrogen content in the middle of the modification layer.

The deposition of κ-alumina should be controlled (in a manner known to those skilled in the art) so that the epitaxial growth of κ-$Al_2O_3$ which is orthorhombic (point group is mm 2, space group is Pna $2_1$ and the lattice parameters are a=4.834 Å, b=8.310 Å and c=8.937 Å) onto the modification layers and epitaxial growth of modification layers on κ-$Al_2O_3$ layers can be maintained throughout the whole multilayer. The orientation relationship between κ-$Al_2O_3$ and the modification layer, which exhibits a fcc structure is as follows:

$(001)_\kappa // (\bar{1}11)_{mod}$ $[100]_\kappa // [\bar{1}\bar{1}2]_{mod}$

Atop the outermost layer of alumina there may be applied an optional TiN layer for decorative purposes. This TiN layer can have a thickness of from 0.5–2 μm, preferably about 1 μm.

Utilization of the multilayer coated cemented carbide bodies of the present invention as inserts in metal cutting have demonstrated that the use of these coatings and parts have advantageous results in such applications. These results are presented graphically in FIGS. 6 and 7 and are described below in regard to the Examples.

It has also been determined that the total thickness of the oxide layer can vary depending upon the particular type of metal cutting operation for which the insert is to be utilized. For example, inserts to be used in milling need a total thickness of the aluminum multilayer from about 4–6 μm while inserts used for mining operations generally should have a thicker coating in the range of about 8–10 μm.

The chipping resistance of the multi-alumina oxide layer coating can be considerably improved by wet-blasting the outer surface of the alumina coating. Wet blasting can also be performed after deposition of each alumina layer which results in finer-grained alumina interlayers disclosed in my copending application Ser. No. 08/390,506 (Attorney Docket No. 024444-111) now U.S. Pat. No. 5,635,247.

Although the wear properties of the increased multilayer inserts are not as favorable as those inserts having 6 to 8 layers, it has also unexpectedly been found that there are different colors obtainable with different numbers of layers. For example, the 15-layered insert is a green color while the 32-layered insert is blue in color. Thus, the present method may be used to produce inserts of different colors with acceptable properties. Such different color schemes may be desired under certain circumstances.

The invention is additionally illustrated in connection with the following Examples which are to be considered as illustrative of the present invention. It should be understood, however, that the invention is not limited to the specific details of the Examples.

EXAMPLE 1

Commercial cemented carbide inserts of composition 85.5% WC, 6% TaC, 2.5% TiC and 5.5% Co are coated under the following coating conditions

| Gas Mixture | Balance | Duration | Temperature | Pressure |
|---|---|---|---|---|
| Step 1, TiC Coating | | | | |
| $TiCl_4$:3.5% $CH_4$:5.5% | $H_2$ | 200 minutes | 1020° C. | 50 mbar |
| Step 2, Alumina Coating | | | | |
| $AlCl_3$:2.1% $CO_2$:3.7% $H_2S$:0.02% | $H_2$ | 90 minutes | 1000° C. | 50 mbar |
| Step 3, Alumina Coating | | | | |
| $AlCl_3$:2.1% $CO_2$:3.7% $H_2S$:0.02% | $H_2$ | 90 minutes | 1000° C. | 50 mbar |
| Step 4, Alumina Coating | | | | |
| $AlCl_3$:2.1% $CO_2$:3.7% $H_2S$:0.02% | $H_2$ | 90 minutes | 1000° C. | 50 mbar |
| Step 5, Alumina Coating | | | | |
| $AlCl_3$:2.1% $CO_2$:3.7% $H_2S$:0.02% | $H_2$ | 90 minutes | 1000° C. | 50 mbar |
| Step 6, Alumina Coating | | | | |
| $AlCl_3$:2.1% $CO_2$:3.7% $H_2S$:0.02% | $H_2$ | 90 minutes | 1000° C. | 50 mbar |
| Step 7, Alumina Coating | | | | |
| $AlCl_3$:2.1% $CO_2$:3.7% $H_2S$:0.02% | $H_2$ | 90 minutes | 1000° C. | 50 mbar |
| Step 8, Alumina Coating | | | | |
| $AlCl_3$:2.1% $CO_2$:3.7% $H_2S$:0.02% | $H_2$ | 90 minutes | 1000° C. | 50 mbar |
| Step 9, Alumina Coating | | | | |
| $AlCl_3$:2.1% $CO_2$:3.7% $H_2S$:0.02% | $H_2$ | 90 minutes | 1000° C. | 50 mbar |

This treatment results in the following coating structure:
1. TiC coating thickness 3 μm.
2. κ-alumina layer thickness about 1 μm.
3. κ-alumina layer thickness about 1 μm.
4. κ-alumina layer thickness about 1 μm.
5. κ-alumina layer thickness about 1 μm.
6. κ-alumina layer thickness about 1 μm.
7. κ-alumina layer thickness about 1 μm.
8. κ-alumina layer thickness about 1 μm.
9. κ-alumina layer thickness about 1 μm.

The coated insert has a brown color (instead of the black color of the insert with a single layer coating of κ-alumina).

Figure 2A:
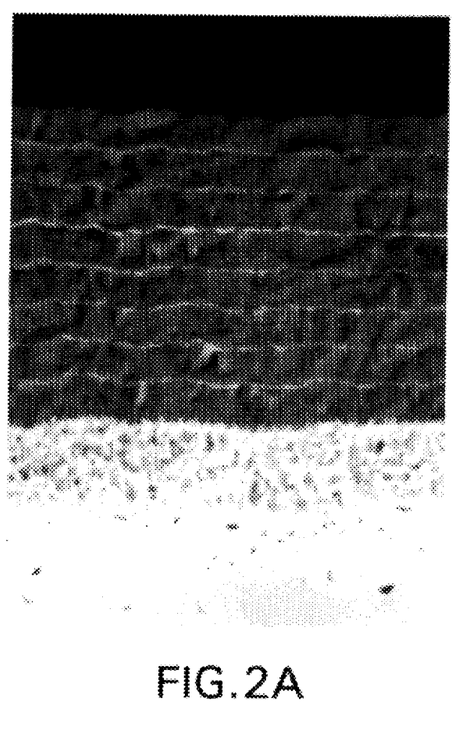
FIG. 2A is an SEM (8000X) of a cross-section of a cemented carbide insert having 8 layers of κ-alumina.
Figure 2B:
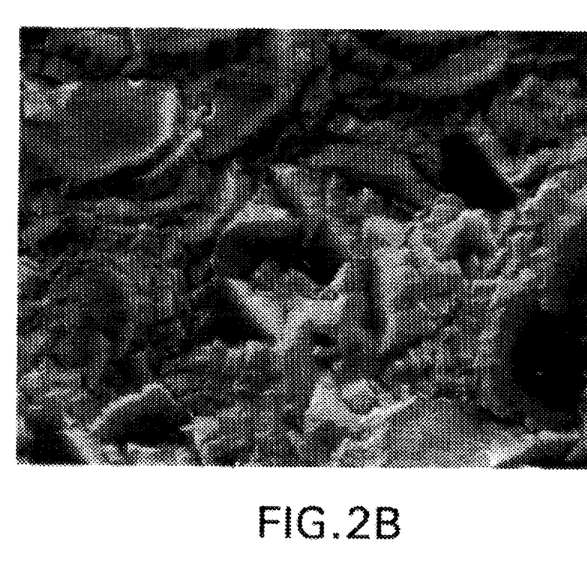
FIG. 2B is an SEM of the surface of the insert of FIG. 2A.

A cross-section of such a coated insert is shown in FIG. 2A while FIG. 2B shows the surface morphology of that insert.

EXAMPLE 2 (COMPARATIVE)

Example 1 is repeated except that the coating is continued so that the total number of layers in the coating thickness is 15 layers of alumina. The coated insert has a green color.

Figure 3A:
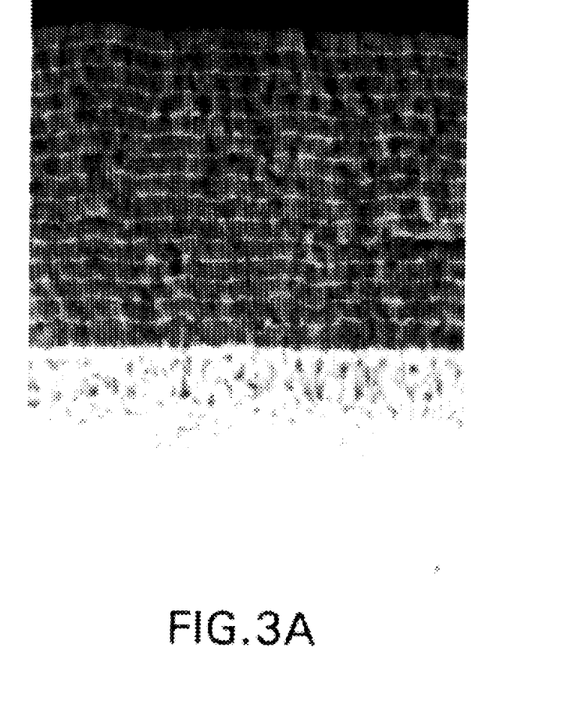
FIG. 3A is an SEM (8000X) of a cross-section of a cemented carbide insert having 15 layers of κ-alumina.
Figure 3B:
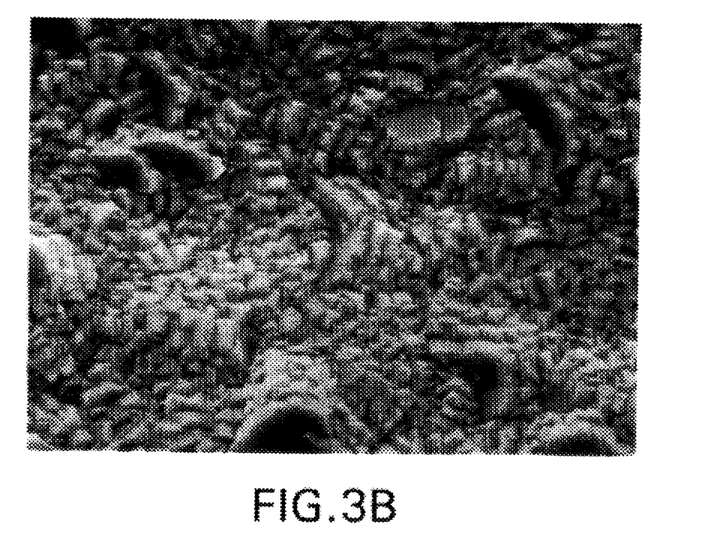
FIG. 3B is an SEM of the surface of the insert of FIG. 3A.

A cross-section of such a coated insert is shown in FIG. 3A while FIG. 3B shows the surface morphology of that insert.

EXAMPLE 3 (COMPARATIVE)

Example 1 is repeated except that the coating is continued so that the total number of layers in the coating thickness is 32 layers. The coated insert has a blue color.

Figure 4A:
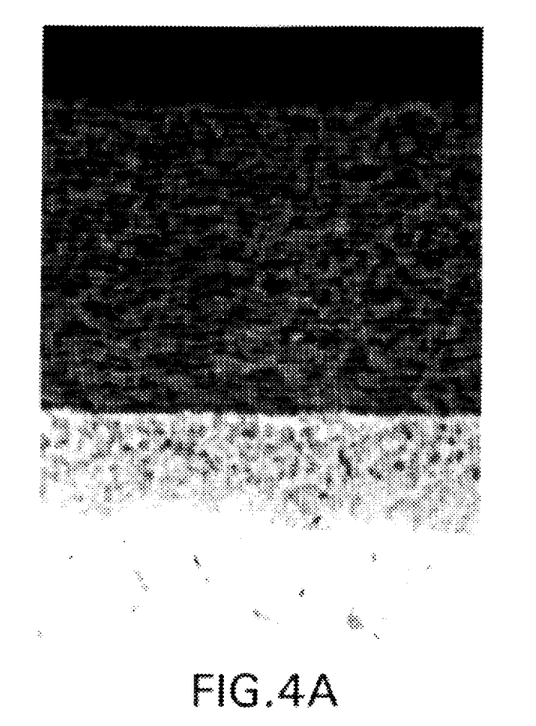
FIG. 4A is an SEM (8000X) of a cross-section of a cemented carbide insert having 32 layers of κ-alumina.
Figure 4B:
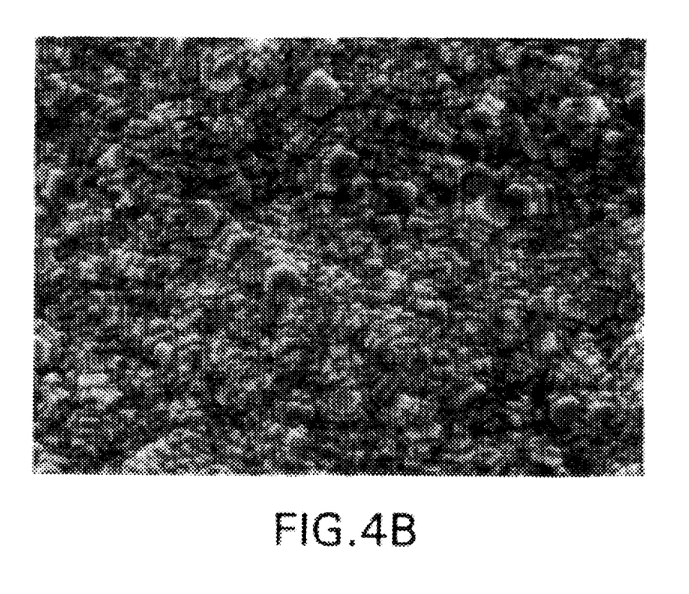
FIG. 4B is an SEM of the surface of the insert of FIG. 4A.
Figure 5A:
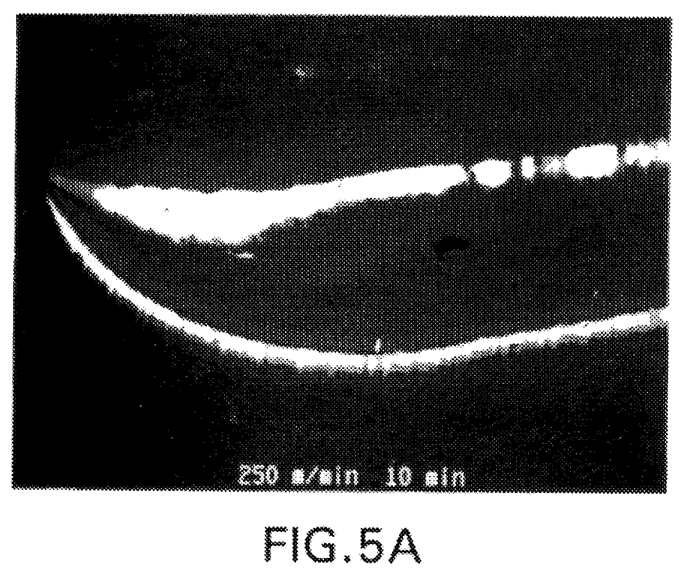
FIG. 5A is a photomicrograph (50X) of a cemented carbide insert having 1 layer of κ-alumina after cutting tests at 250 m/min for 10 minutes showing crater wear.
Figure 5B:
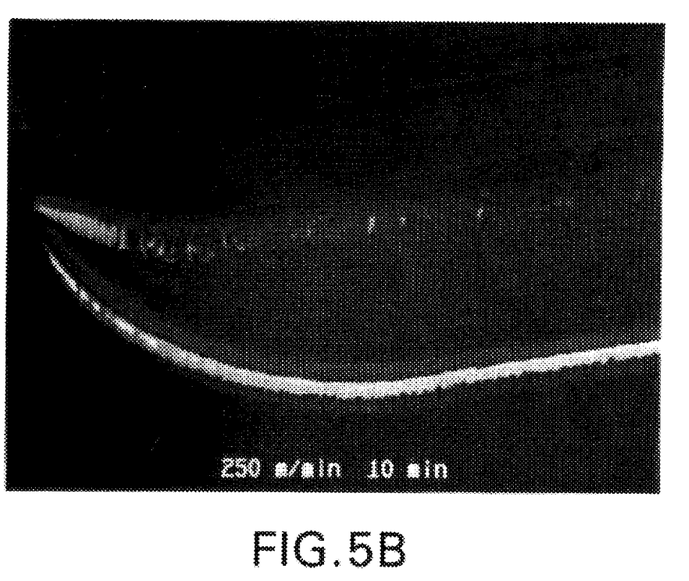
FIG. 5B is a photomicrograph (50X) of a cemented carbide insert having 8 layers of κ-alumina after cutting tests at 250 m/min for 10 minutes showing crater wear.
Figure 5C:
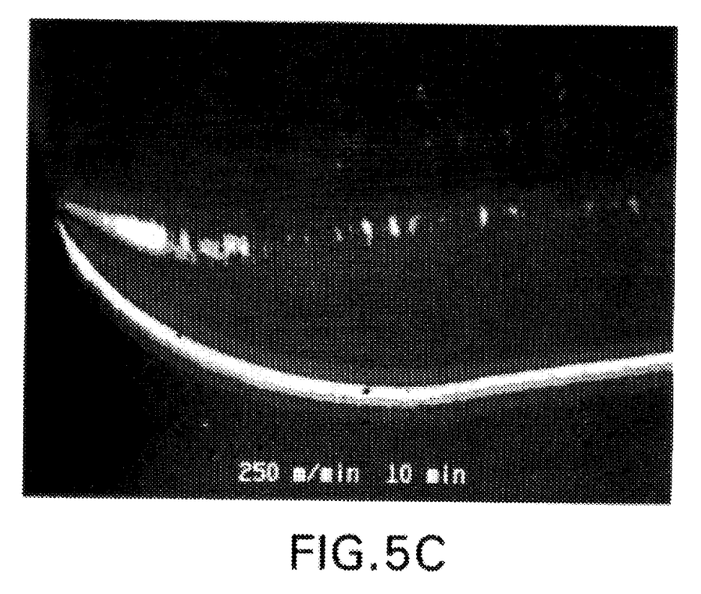
FIG. 5C is a photomicrograph (50X) of a cemented carbide insert having 15 layers of κ-alumina after cutting tests at 250 m/min for 10 minutes showing crater wear.
Figure 5D:
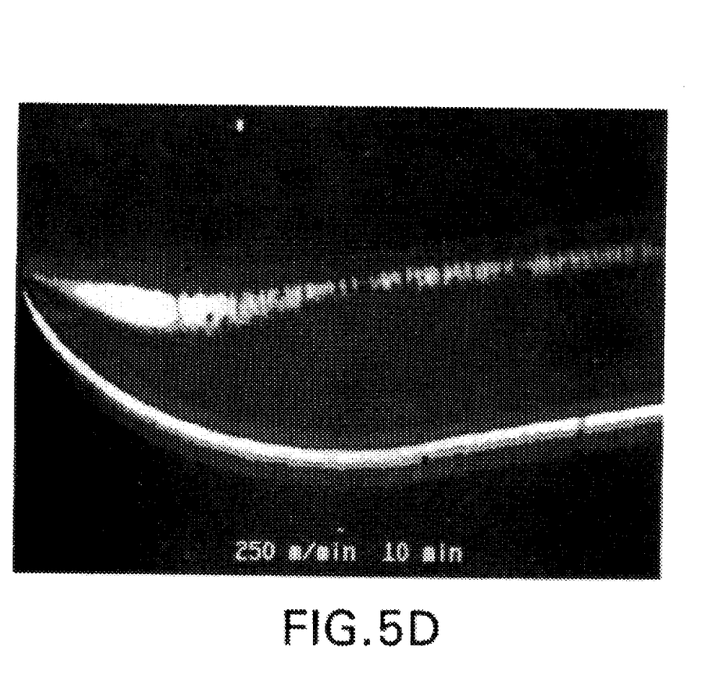
FIG. 5D is a photomicrograph (50X) of a cemented carbide insert having 32 layers of κ-alumina after cutting tests at 250 m/min for 10 minutes showing crater wear.

A cross-section of such a coated insert is shown in FIG. 4A while FIG. 4B shows the surface morphology of that insert.

EXAMPLE 4 (COMPARATIVE)

Example 1 is repeated except that the coating is continued so that the total number of layers in the coating thickness is 4 layers.

EXAMPLE 5

Figure 1A:
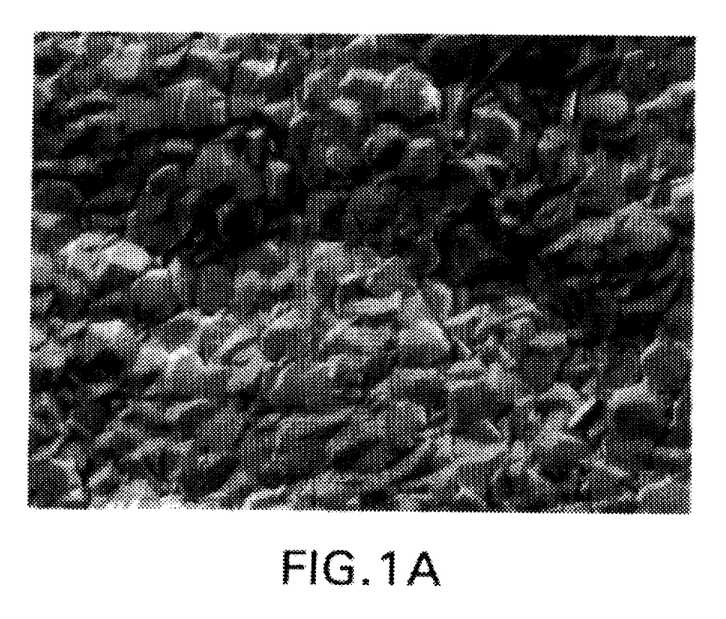
FIG. 1A is a scanning electron micrograph (SEM) (10000X) of a cross-section of a cemented carbide insert having a single layer of κ-alumina.
Figure 1B:
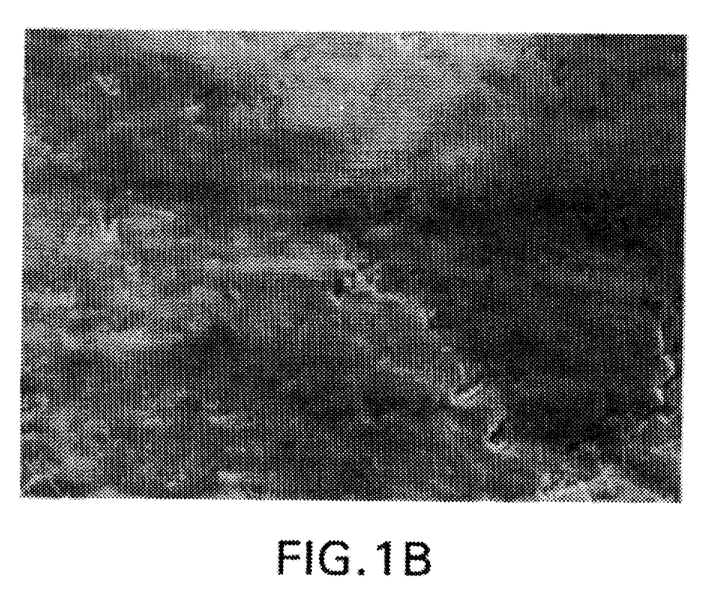
FIG. 1B is an SEM of the surface of the insert of FIG. 1A coated and wet-blasted.

The coated cemented carbide bodies produced in Examples 1, 2, 3 and 4 are tested together with an insert having a single alumina coating (as produced in Example 1, steps 1 and 2). The coated cemented carbide bodies produced in Examples 1, 2, 3 and 4 are tested together with an insert having a single alumina coating (as produced in FIG. 1A and FIG. 2A). The cutting tests are performed in continuous turning tests of the following work piece materials under the following conditions.
Test steel: SS1672 (AISI4340, DIN34CrNiMo6)
Cutting speeds: 200, 250, 275 m/min
Feed: 0.4 mm/rev
Depth of cut: 2.5 mm
Style of Insert: SNUN 120412

Figure 6:
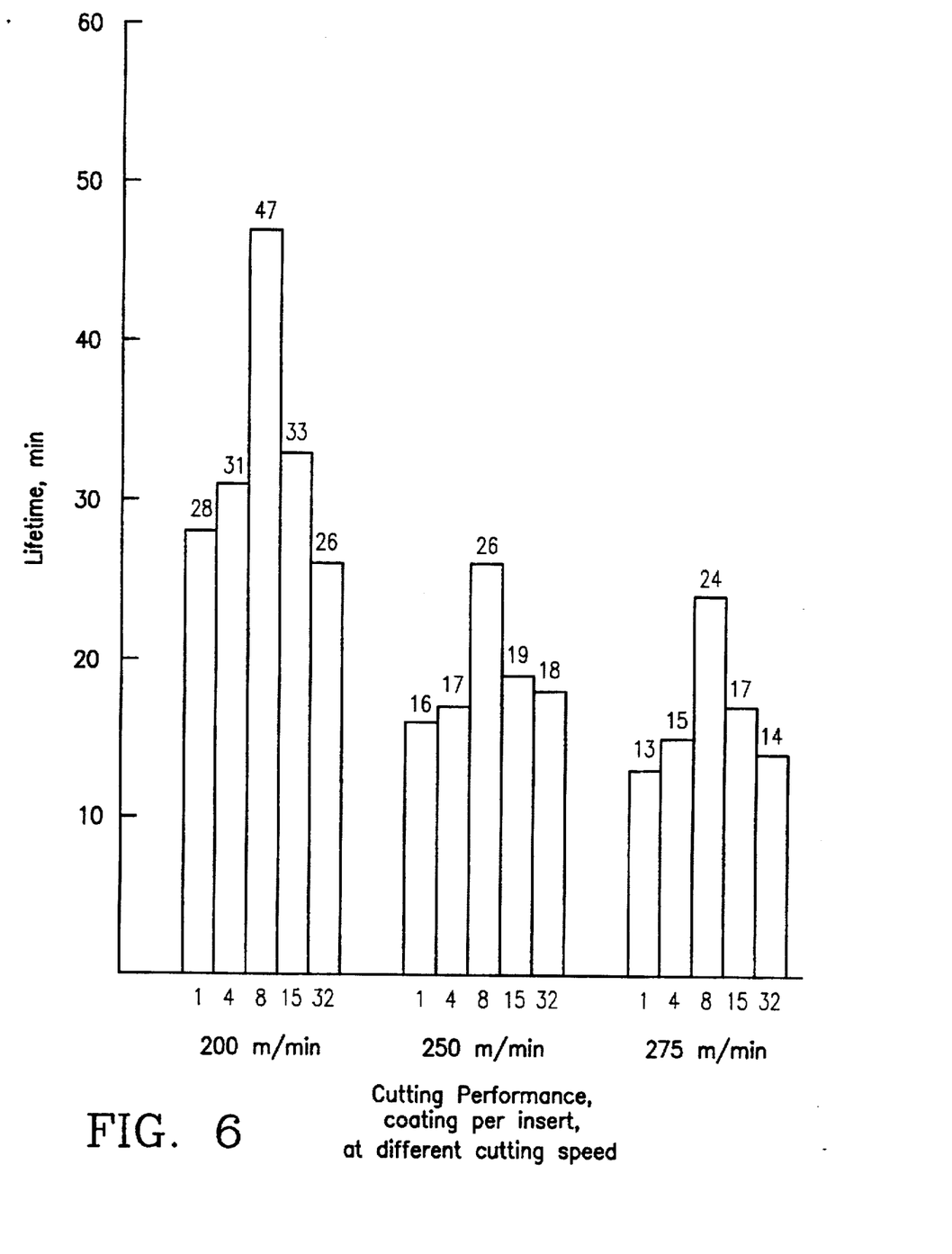
FIG. 6 is a graph of the lifetime achieved in cutting wear tests at various speeds for cemented carbide inserts with different layers of alumina coating.
Figure 7:
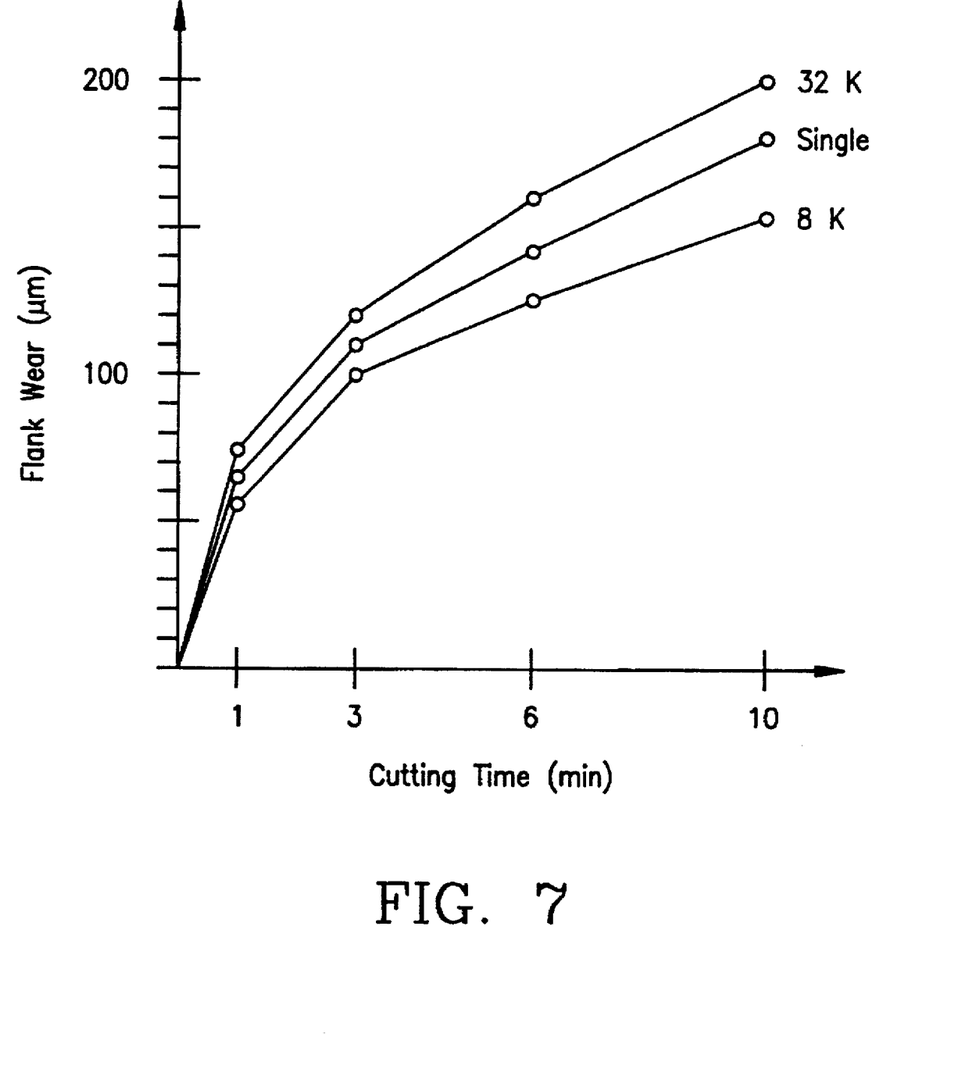
FIG. 7 is a graph of the flank wear of cemented carbide inserts with different layers of alumina mating.

The results from these tests are shown below and in FIG. 6. It should be emphasized that the results obtained herein are the results of a large number of tests of each of the various inserts and the test results reported here for specific coating type thus represents the average of several cutting edges.

|  | Single | 4xκ | 8xκ | 15xκ | 32xκ |
| --- | --- | --- | --- | --- | --- |
| 200 m/min | 28 min | 30 min | 47 min | 33 min | 26 min |
| 250 m/min | 16 min | 18 min | 26 min | 19 min | 18 min |
| 275 m/min | 13 min | 16 min | 24 min | 17 min | 14 min |

The results clearly demonstrate that an insert having the 8 multilayered coating of alumina coating clearly outperforms an insert having a single layer, 4-layer, 15-layer or 32-layer coating. The layers can be all entirely alumina or all entirely a-alumina or they can be mixtures of layers of κ- and α-alumina. Any given layer can also be a mixture of α- and κ-alumina but in such an instance, one form should be at least 90% of the form of the alumina in that layer.

EXAMPLE 6

Inserts having a single alumina layer, 8 alumina layers and 32 alumina layers (all κ in each instance) were used in metal cutting tests. The flank wear for each insert was measured after 1, 3, 6 and 10 minutes and is shown below in the Table and in FIG. 7. The flank wear resistance for the 8-layered insert was considerably better than that of both other inserts.

|  | 1 minute | 3 minutes | 6 minutes | 10 minutes |
| --- | --- | --- | --- | --- |
| single | 65 μm | 110 μm | 145 μm | 178 μm |
| 8κ | 59 μm | 98 μm | 125 μm | 155 μm |
| 32κ | 72 μm | 120 μm | 160 μm | 196 μm |

Figure 8:
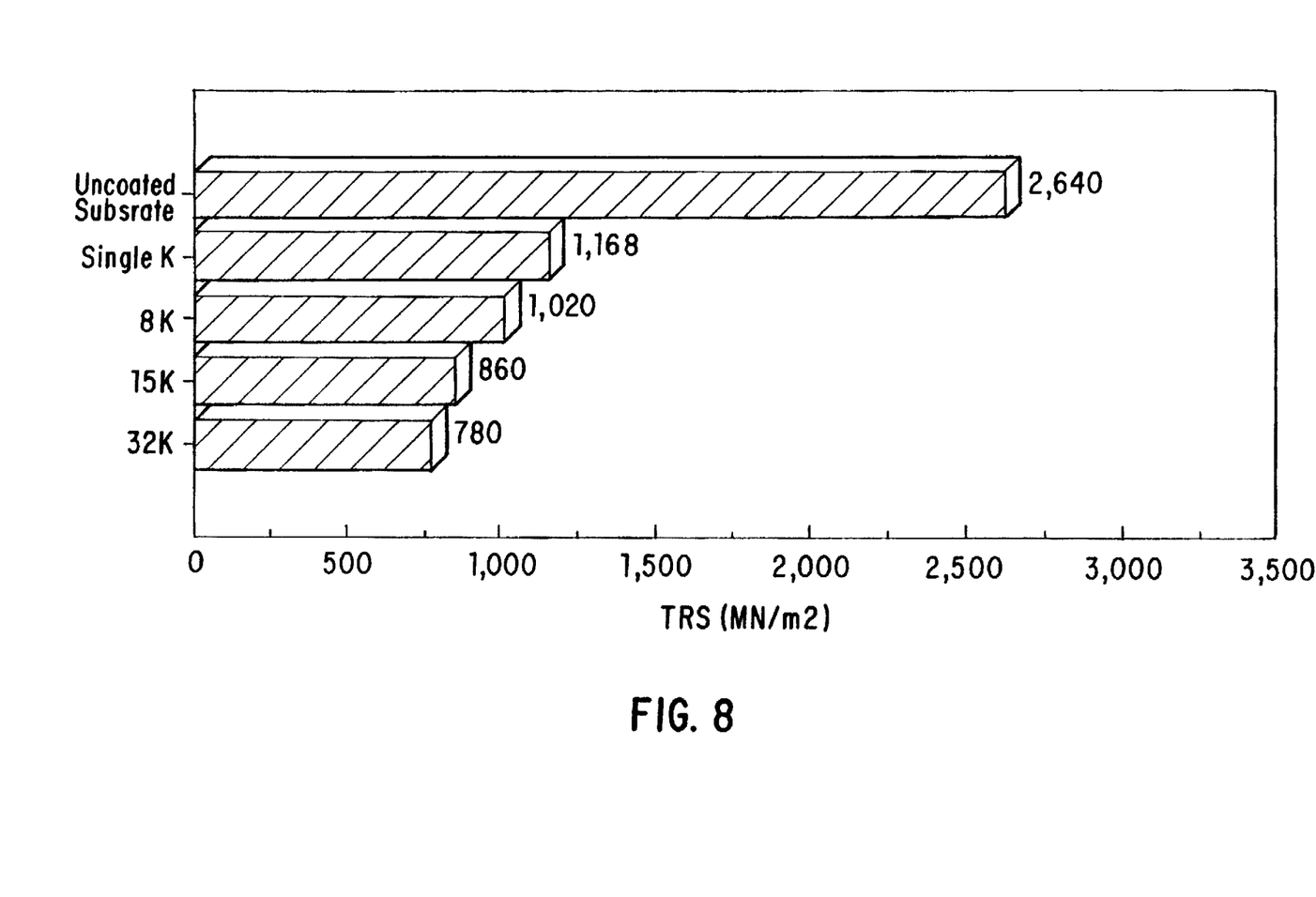
FIG. 8 is a graph of Transverse Rupture Strength for uncoated as well as coated cemented carbide bodies.

The transverse rupture strength of the insert coated with 8 layers is slightly below that of a single coated cemented carbide insert but considerably better than those of the 15- and 32-layered inserts (see FIG. 8).

The principles, preferred embodiments and modes of operation of the present invention have been described in the foregoing specification. The invention which is intended to be protected herein, however, is not to be construed as limited to the particular forms disclosed, since these are to be regarded as illustrative rather than restrictive. Variations and changes may be made by those skilled in the art without departing from the spirit of the invention.

What is claimed is:

1. In a coated sintered cemented carbide having a substrate containing at least one metal carbide and a binder metal and a coating having a plurality of layers of alumina, the improvement resulting in optimized crater wear and flank wear resistance comprising having 6–8 alumina layers, the total thickness of the alumina layers being up to about 15 μm.

2. In the coated sintered cemented carbide of claim 1 wherein the said alumina layers comprise κ-alumina.

3. In the coated sintered cemented carbide of claim 1 wherein the said alumina layers comprise α-alumina.

4. In the coated sintered cemented carbide of claim 1 wherein the total thickness of the alumina layers is from about 5–15 μm.

5. In the coated sintered cemented carbide of claim 1 wherein the total thickness of the alumina layers is from about 8–10 μm.

6. In the coated sintered cemented carbide of claim 1 wherein the total thickness of the alumina layers is from about 4–6 μm.

7. In the coated sintered cemented carbide of claim 1 wherein the thickness of each alumina layer is up to 1.5 μm.

8. In the coated sintered cemented carbide of claim 7 wherein the thickness of each alumina layer is from about 0.5–1 μm.

9. In the coated sintered cemented carbide of claim 1 wherein the coating has 8 layers of alumina.

10. In the coated sintered cemented carbide of claim 1 wherein the surface of the coated layer is blasted.

* * * * *